(12) United States Patent
Zhang

(10) Patent No.: US 7,985,631 B2
(45) Date of Patent: *Jul. 26, 2011

(54) SEMICONDUCTOR ASSEMBLY WITH ONE METAL LAYER AFTER BASE METAL REMOVAL

(75) Inventor: Tonglong Zhang, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/762,960

(22) Filed: Apr. 19, 2010

(65) Prior Publication Data

US 2010/0200970 A1  Aug. 12, 2010

Related U.S. Application Data

(63) Continuation of application No. 11/790,873, filed on Apr. 27, 2007, now Pat. No. 7,704,800.

(60) Provisional application No. 60/856,788, filed on Nov. 6, 2006.

(51) Int. Cl.
*H01L 21/00* (2006.01)

(52) U.S. Cl. ........ 438/126; 438/106; 438/458; 438/611; 257/E23.116; 257/E23.151

(58) Field of Classification Search .................. 257/273, 257/690; 438/615, 126, 106, 458, 611
See application file for complete search history.

(56) References Cited

U.S. PATENT DOCUMENTS

| | | | |
|---|---|---|---|
| 5,976,912 | A | 11/1999 | Fukutomi et al. |
| 6,413,849 | B1 | 7/2002 | Yeoh et al. |
| 7,704,800 | B2 | 4/2010 | Zhang |
| 2003/0134450 | A1 | 7/2003 | Lee |
| 2006/0115931 | A1 | 6/2006 | Hsu |
| 2006/0267210 | A1 | 11/2006 | Yamano et al. |
| 2008/0048311 | A1 | 2/2008 | Ikenaga et al. |

*Primary Examiner* — Matthew Smith
*Assistant Examiner* — Wilner Jean Baptiste
(74) *Attorney, Agent, or Firm* — Sterne, Kessler, Goldstein & Fox P.L.L.C.

(57) ABSTRACT

A method for packaging an integrated circuit. A barrier metal pattern is disposed on a baseplate. A conductive layer is disposed on the barrier metal pattern. A photoresist having a pattern is applied to the conductive layer. A via is then disposed on the conductive layer. An integrated circuit is coupled to the via and encapsulated. Then, at least a part of the baseplate is removed. An integrated circuit package is produced by the method.

22 Claims, 12 Drawing Sheets

SEMICONDUCTOR ASSEMBLY WITH ONE METAL LAYER AFTER BASE METAL REMOVAL

CROSS REFERENCE TO RELATED APPLICATIONS

This application is a continuation of U.S. Non-Provisional patent application Ser. No. 11/790,873, filed on Apr. 27, 2007, now allowed, which claims the benefit of U.S. Provisional Patent Application No. 60/856,788, filed on Nov. 6, 2006, which is incorporated by reference herein in its entirety.

FIELD OF THE INVENTION

The present invention generally relates to integrated circuit packaging.

BACKGROUND OF THE INVENTION

There is demand for integrated circuits that are smaller and capable of performing more functions than conventional integrated circuits. Thus, to increase circuit density, manufacturers continue to decrease process feature sizes of integrated circuits dramatically, such as from 0.13 um to 90 nm and even 65 nm. The resultant increase in circuit density on a die increases a density of in/out ports that couple signals and power on and off of the die. In other words, the number of in/out ports in a given die area increases.

The in/out ports on the die are coupled via an integrated circuit package, such as a conventional fine-pitch flip-chip ball grid array (BGA) with a conventional interposer, to a circuit external to the integrated circuit package, such as a circuit on a printed circuit board. The conventional fine-pitch flip-chip BGA has multiple conductive and dielectric layers which form multiple redistribution layers (RDLs). An RDL relocates an in/out port contact. The fine-pitch flip-chip BGA has an expensive manufacturing process due to the many steps required to manufacture a multi-layer device. The fine-pitch flip-chip BGA also has poor thermal performance due to the thermally insulative effect of multiple RDLs. Thus, as the density of in/out ports increases, the number of RDLs and manufacturing costs increase with a consummate reduction in thermal performance.

The in/out ports on the die may also be coupled via a common quad flat non-leaded package (QFM). The QFM package requires a conventional leadframe insulated from the die with a dielectric layer and having leads placed beyond a perimeter of the die. Thus, terminals coupling in/out ports of the die cannot be located between the die and the leadframe. This limits the in/out port density of the QFM.

As the density of in/out ports on the die increases, conventional wafer-level chip scale packages (CSP) for a small die, such as those listed above, must be capable of coupling an increased density of in/out ports. However, the conventional CSP do not accommodate an in/out port density that is high enough. Thus, as the process feature size becomes smaller, conventional CSPs do not accommodate commensurate increases in the density of in/out ports.

Therefore, what is needed is an improved semiconductor package and manufacturing process that overcomes the shortcomings described above.

BRIEF SUMMARY OF THE INVENTION

In an embodiment, there is a method for packaging an integrated circuit. A barrier metal pattern is disposed on a baseplate. A conductive layer is disposed on the barrier metal pattern. A photoresist having a pattern is applied to the conductive layer. A via is then disposed on the conductive layer. An integrated circuit is coupled to the via and encapsulated. At least a part of the baseplate is removed.

Additional features and advantages of the invention are set forth in the description that follows, and in part are apparent from the description, or may be learned by practice of the invention. The advantages of the invention are realized and attained by the structure and particularly pointed out in the written description and claims hereof as well as the appended drawings.

Both the foregoing general description and the following detailed description are exemplary and explanatory and are intended to provide further explanation of the invention as claimed.

BRIEF DESCRIPTION OF THE DRAWINGS/FIGURES

The accompanying drawings illustrate the present invention and, together with the description, further serve to explain the principles of the invention and to enable one skilled in the pertinent art to make and use the invention.

FIG. 1 illustrates a method for packaging an integrated circuit (IC).

FIGS. 2A-F further illustrate the method of FIG. 1.

Figure 6:
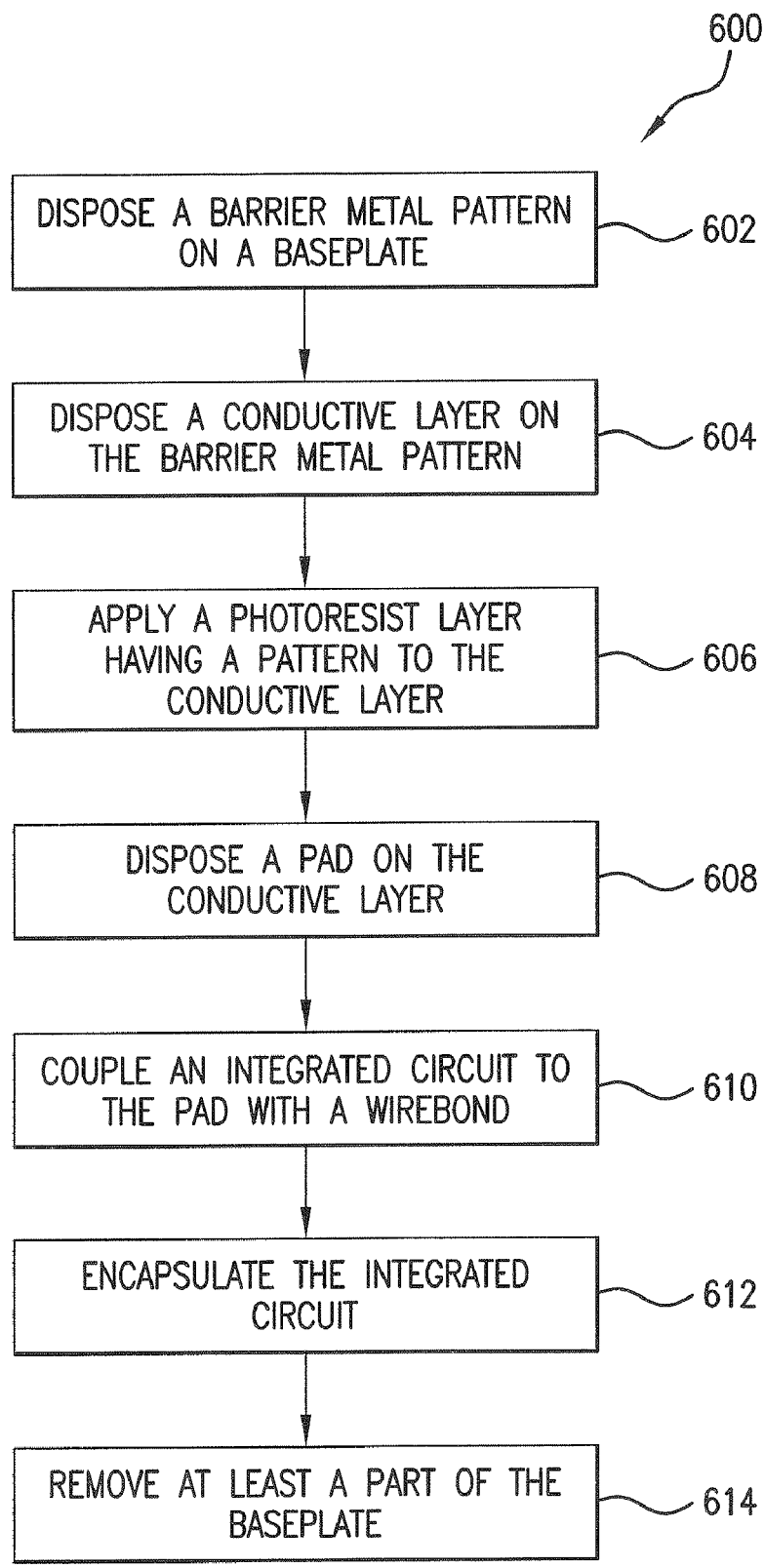
FIG. 6 illustrates a method for packaging an IC coupled with a wirebond.

FIGS. 7A-F further illustrate the method of FIG. 6.

Figure 8:
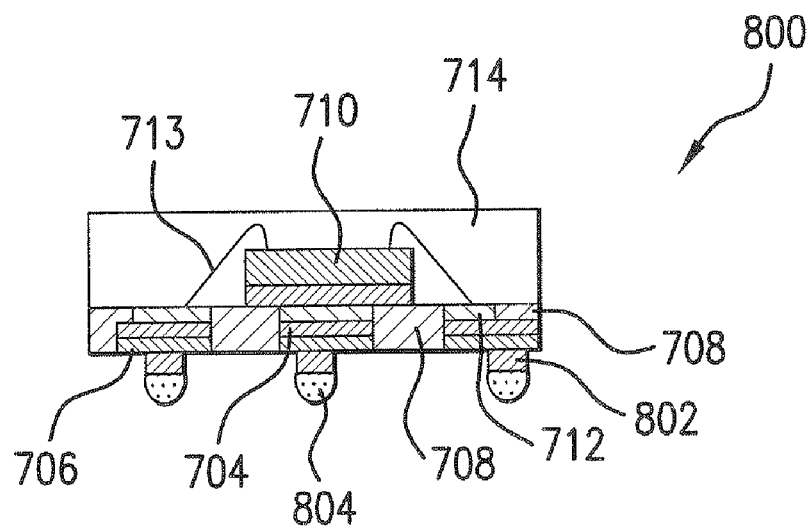

FIG. 8 illustrates a wirebonded IC package having a solder ball coupled to a metal post.

Figure 9:
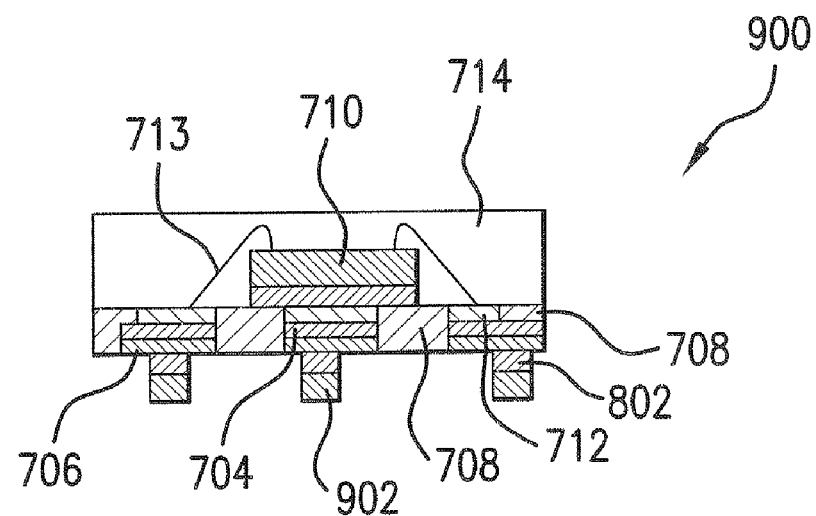

FIG. 9 shows a wirebonded IC package having a plated metal post.

Figure 10:
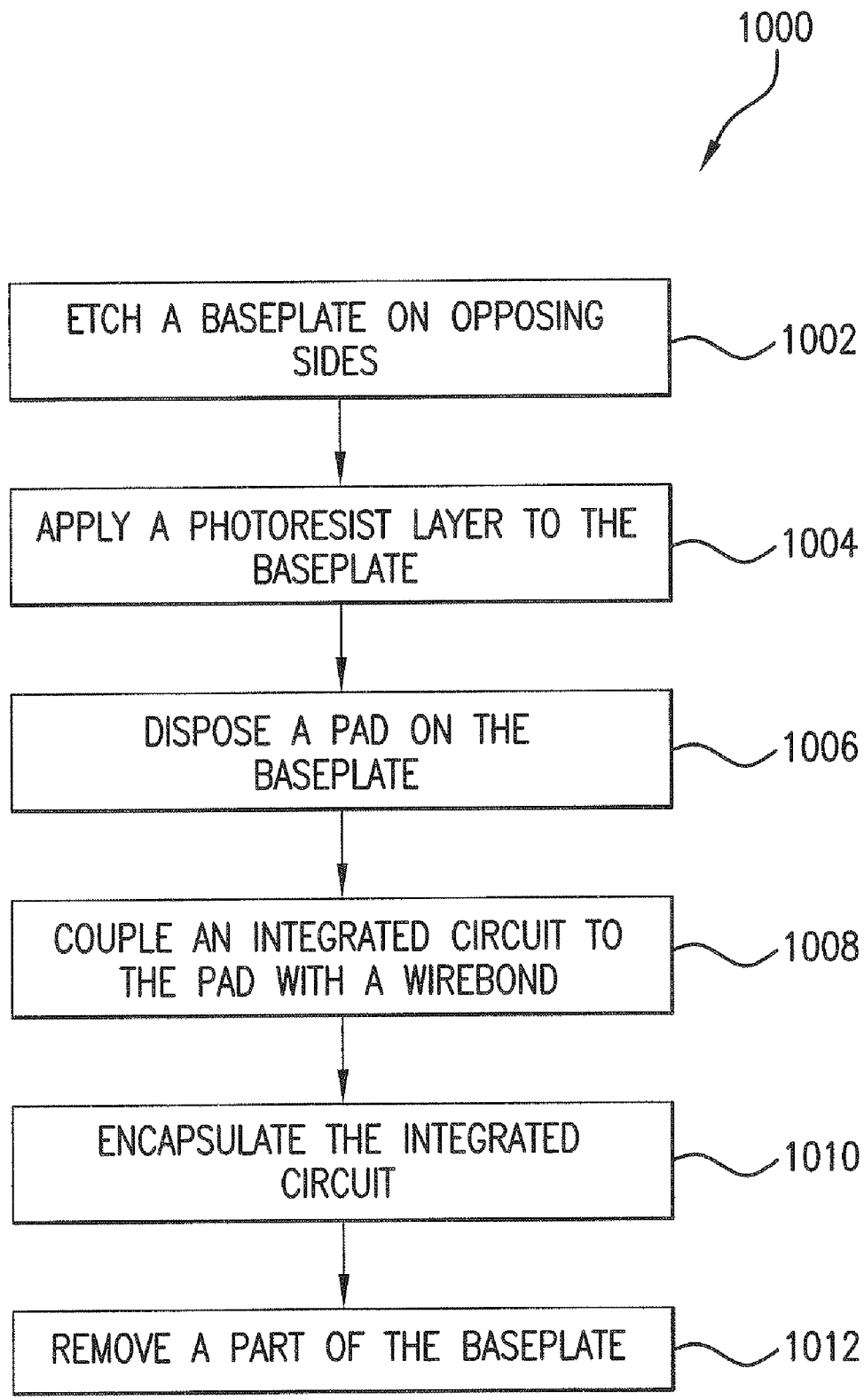

FIG. 10 illustrates a method for packaging a wirebonded IC with an interposer having a routing pattern and metal posts.

FIGS. 11A-D further illustrate the method of FIG. 10.

Figure 12:
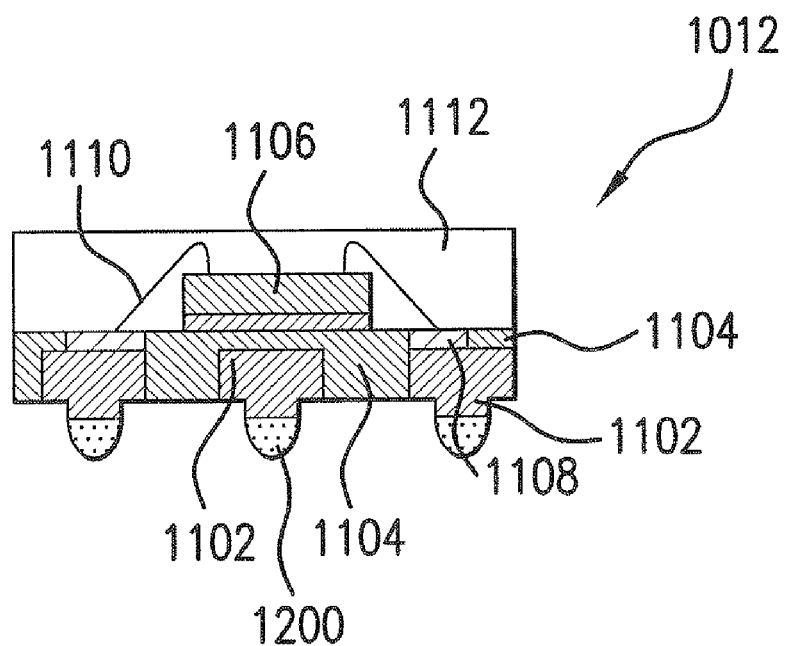

FIG. 12 illustrates a method for packaging a wirebonded IC with an interposer having a routing pattern and a solder ball coupled to a metal post.

Figure 13:
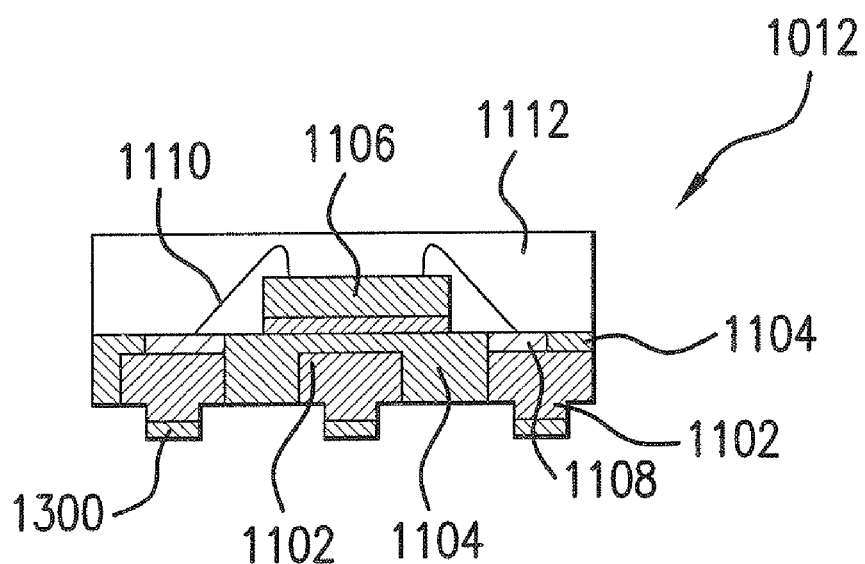

FIG. 13 illustrates a method for packaging a wirebonded IC with an interposer having a routing pattern and a plated metal post.

The invention is described with reference to the accompanying drawings. The drawing in which an element first appears is typically indicated by the leftmost digit(s) in the corresponding reference number.

DETAILED DESCRIPTION OF THE INVENTION

This specification discloses one or more embodiments that incorporate the features of this invention. The disclosed embodiment(s) merely exemplify the invention. The scope of the invention is not limited to the disclosed embodiment(s). The invention is defined by the claims.

The embodiment(s) described and references in the specification to "one embodiment," "an embodiment," "an example embodiment," etc., indicate that the embodiment(s) described may include a particular feature, structure, or characteristic. However, every embodiment may not necessarily include the particular feature, structure, or characteristic.

Moreover, such phrases are not necessarily referring to the same embodiment. When a particular feature, structure, or characteristic is described in connection with an embodiment, it is understood that it is within the knowledge of one skilled in the art to effect such feature, structure, or characteristic in connection with other embodiments, whether or not explicitly described.

There are two broad categories of semiconductor packages described herein. One is a flip-chip integrated circuit (IC) package with one metal layer. A second is a wirebond BGA package with one metal layer. An integrated circuit package may be produced by the methods described herein. As used herein, the terms "semiconductor assembly," "integrated circuit package," and "package" are used interchangeably. Further, as used herein, the terms "solder ball," "bump," and "solder bump" are used interchangeably.

FIGS. 1-5 illustrate a flip-chip IC package, with one metal layer, that eliminates a conventional wafer-level redistribution layer (RDL) structure, thus reducing design and manufacturing expenses. Instead of a wafer-level RDL, the flip-chip IC package has a leadframe in an interposer to fan out in/out (I/O) ports. Thus, the flip-chip IC package accommodates a sufficient number of I/O ports while providing a standard ball pitch for coupling to another circuit, such as a circuit on a circuit board. The flip-chip IC package with one metal layer is also thinner than a conventional fine-pitch flip-chip BGA or LGA package, thus the flip-chip IC package has better thermal characteristics. In an example, the flip-chip IC package with one metal layer may have metal posts to couple the leadframe to a circuit board.

FIGS. 6-13 illustrate a wirebond BGA package with one metal layer that eliminates a conventional interposer substrate to reduce design and manufacturing expenses. A conventional BGA utilizing wirebonds and a fine-pitch array has a conventional interposer substrate that is either organic, a tape, or ceramic. The conventional interposer substrate contributes to approximately one-half of a total cost of a conventional BGA package. Thus, eliminating the conventional interposer substrate significantly reduces IC package cost. In addition to eliminating the conventional interposer substrate, the wirebond BGA package with one metal layer is also thinner than the conventional wirebond fine pitch BGA structure. Thus, the wirebond BGA package with one metal layer has better thermal characteristics. In an example, the wirebond BGA package with one metal layer may have metal posts to couple the package to a circuit board.

I. Flip-Chip IC Package with One Metal Layer

Figure 1:
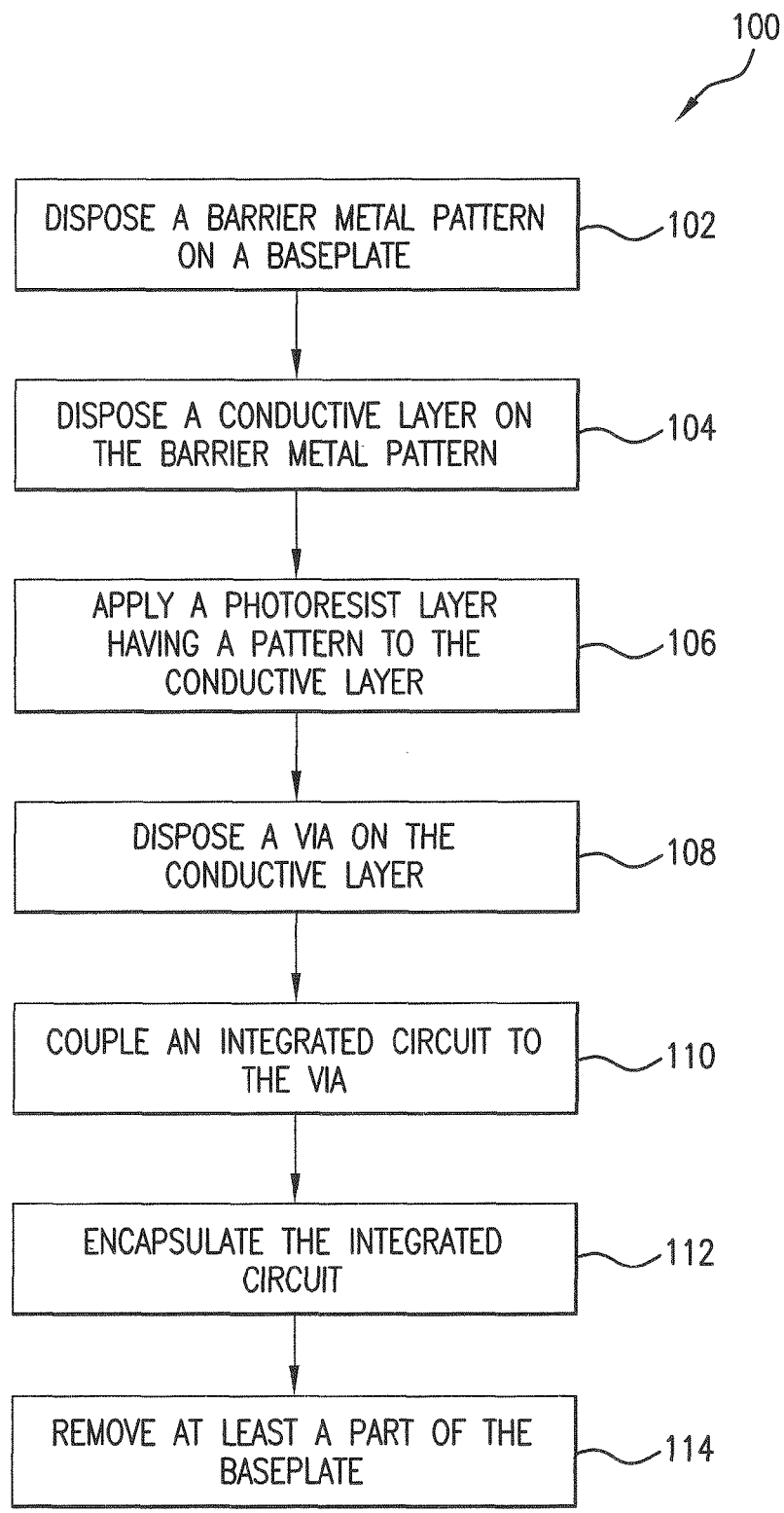

A method for packaging an integrated circuit in a flip-chip IC package with one metal layer 100 is illustrated in FIGS. 1-2.

FIG. 1 illustrates a method 100 for packaging an integrated circuit, such as a flip-chip IC package with one metal layer. In steps 102 and 104, illustrated in FIG. 2A, a contact 200 is disposed on a baseplate 202. The contact 200 has a conductive layer 204 and a barrier layer 206. The barrier layer 206 is a palladium and copper alloy, nickel and copper alloy, or other electrically conductive metal that protects the conductive layer 204 from damage during removal of at least a part of the baseplate 202 in step 114. The contact 200 "fans out", or relocates, at least one I/O port. The baseplate 202 may be copper, aluminum, steel, or may be an alloy containing copper, aluminum, or steel.

Figure 2A:
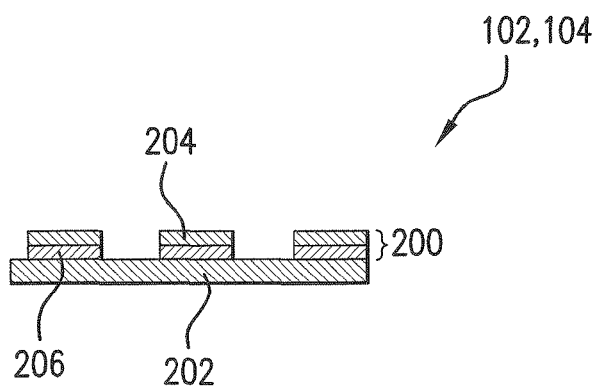
Figure 2B:
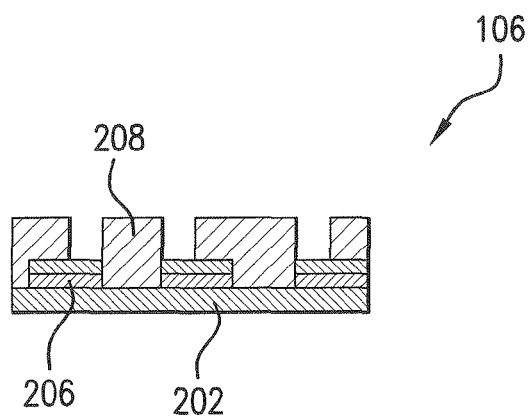

In step 106, shown in FIG. 2B, a solder mask or other photoresist layer 208 having a pattern is applied to the conductive layer 204. The photoresist 208 is patterned to expose the conductive layer 204 where an IC 210 is to be coupled to the conductive layer 204. The photoresist 208 insulates part of the contact 200 and provides mechanical support to the IC package.

Figure 2C:
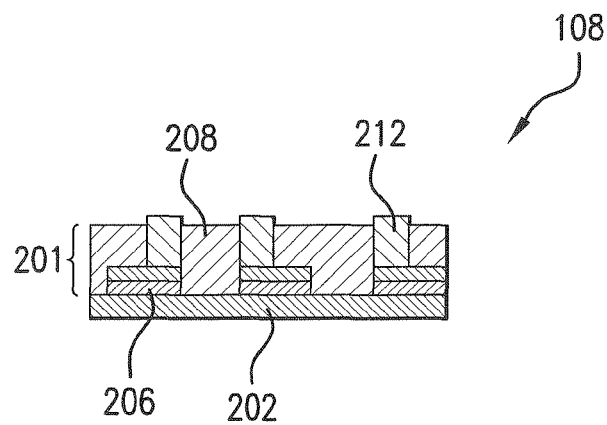

In step 108, depicted in FIG. 2C, a via 212 is disposed on the conductive layer 204. The via 212 may be composed in part of copper. The via 212 is couples the conductive layer 204 to a conductor on the IC 210. At this point, manufacture of an interposer 201 is complete.

Figure 2D:
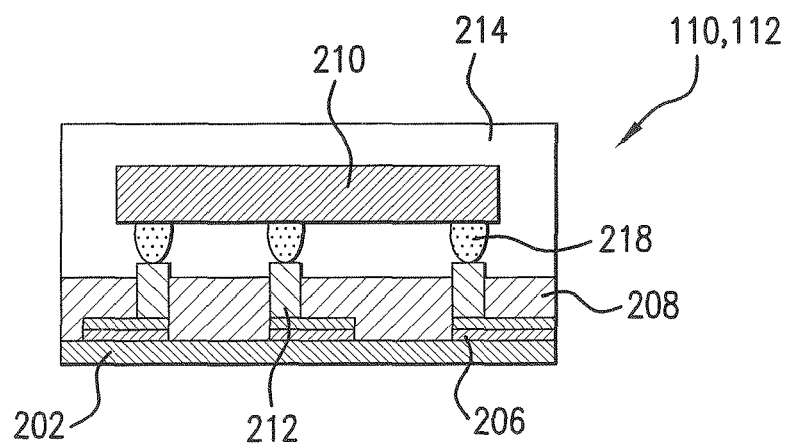

In step 110, illustrated in FIG. 2D, the IC 210 is coupled to the via 212 on the interposer 201. The IC 210 may be coupled by solder reflow of solder 218 or other means such as thermal sonic coupling, thermal compression coupling, or the like.

In step 112, shown in FIG. 2D, the IC 210 is encapsulated with an encapsulant 214 such as epoxy. Encapsulation may be performed by molding or dispensing.

Figure 2E:
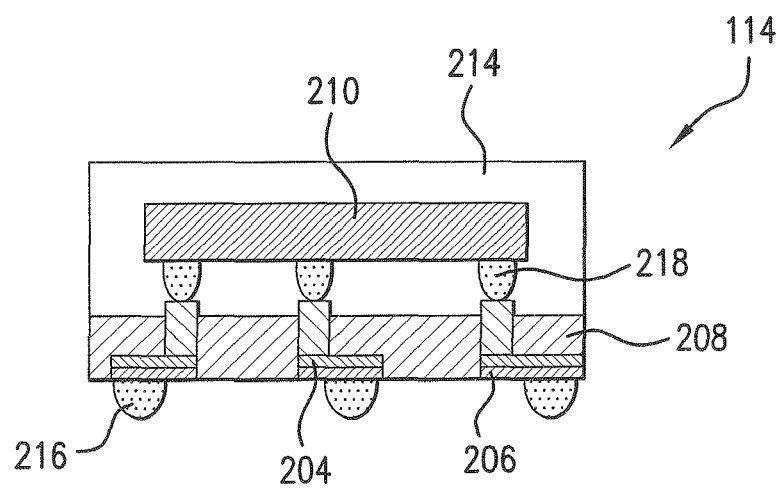
Figure 2F:
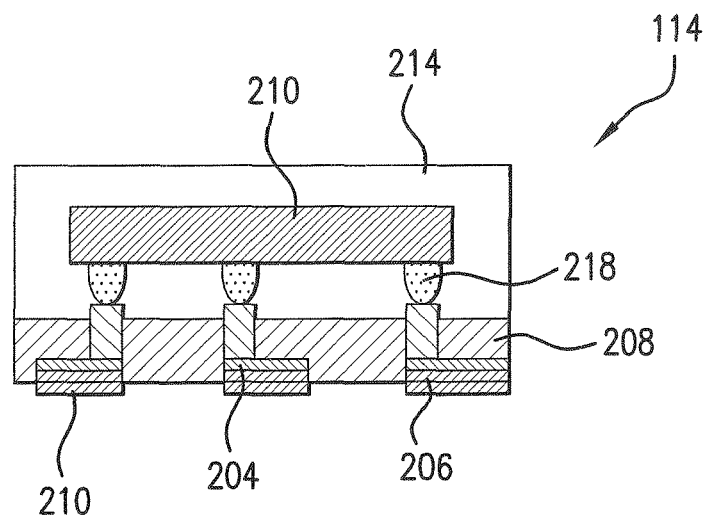

In the step 114, illustrated in FIGS. 2E and 2F, at least a part of the baseplate 202 is removed. Removal may be by etching, grinding, milling, or other metal removal means. As illustrated in FIG. 2E, an optional solder ball 216 may be coupled to the barrier layer 206 so that the contact 200 may be coupled to a printed circuit board. Alternatively, as shown in FIG. 2F, a part of the baseplate 202 not removed is plated with solder 210 so that the contact 200 may be coupled to a printed circuit board. Thus, the packaging method 100 eliminates the conventional wafer-level RDL which reduces a number of manufacturing process steps to reduce manufacturing costs. Eliminating the conventional wafer-level RDL also reduces a thermal barrier to improve thermal performance.

In an example, the flip-chip IC package with one metal layer may include a plurality of vias 212 and a plurality of contacts 200. The plurality of vias 212 has a perimeter that encloses an area. The plurality of contacts 200 also has a perimeter that encloses an area. The area of the plurality of vias 212 is less than the area of the plurality of contacts 200. Thus, the contacts 200 "fan out" a plurality of IC I/O ports coupled to the vias 212 to accommodate an increased number of in/out ports, also known as I/O count, for a given die area.

Multiple flip-chip IC packages with one metal layer may be manufactured on a strip with the steps 102 through 114. The strip is similar in size to a fine pitch BGA strip to ensure compatibility with existing fine pitch BGA processing equipment. A slot may be added in the strip. The slot relieves thermal stresses. During manufacture, multiple flip-chip IC packages are simultaneously encapsulated in the step 112. Then, in an optional step following the step 112, the multiple flip-chip IC packages are singulated into individual flip-chip IC packages by dicing, such as with a wafer saw. The slot may also increase the useful life of a wafer saw used to singulate multiple flip-chip IC packages by reducing the amount of material to be removed by the wafer saw.

Figure 3:
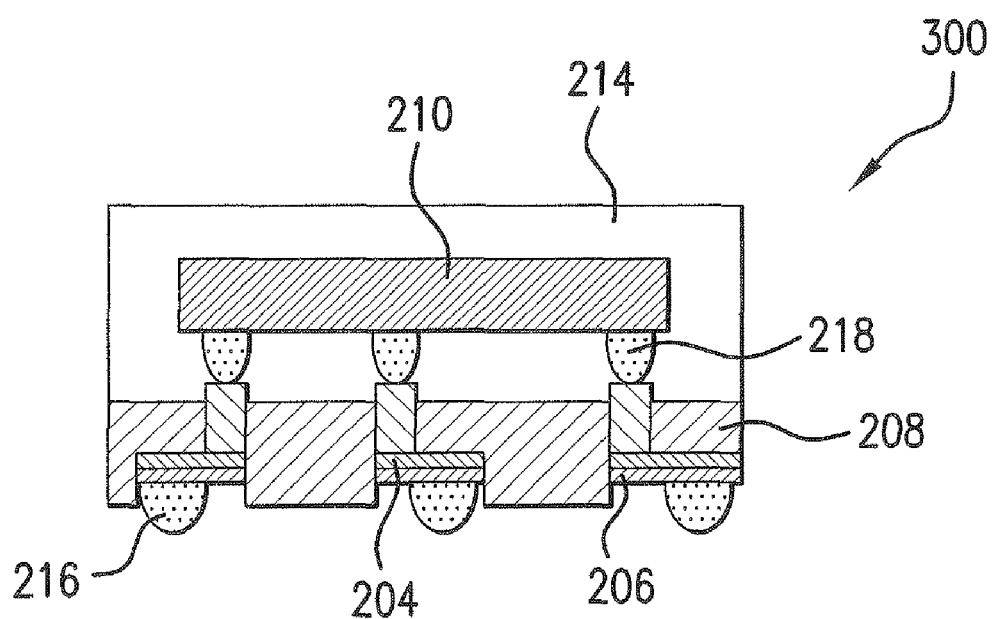
FIG. 3 illustrates a flip-chip IC package having part of a barrier layer removed.

FIG. 3 illustrates a flip-chip IC package 300 where removal of the baseplate 202 also removes part of the barrier layer 206. Thus, the photoresist layer 208 extends beyond a surface of the barrier layer 206 to provide mechanical support and improve heat transfer from the IC 210 to a printed circuit board upon which the flip-chip IC package 300 is mounted. The flip-chip IC package 300 may be manufactured with at least a part of the packaging method 100.

II. Flip-Chip IC Package with One Metal Layer and Metal Posts

Figure 4:
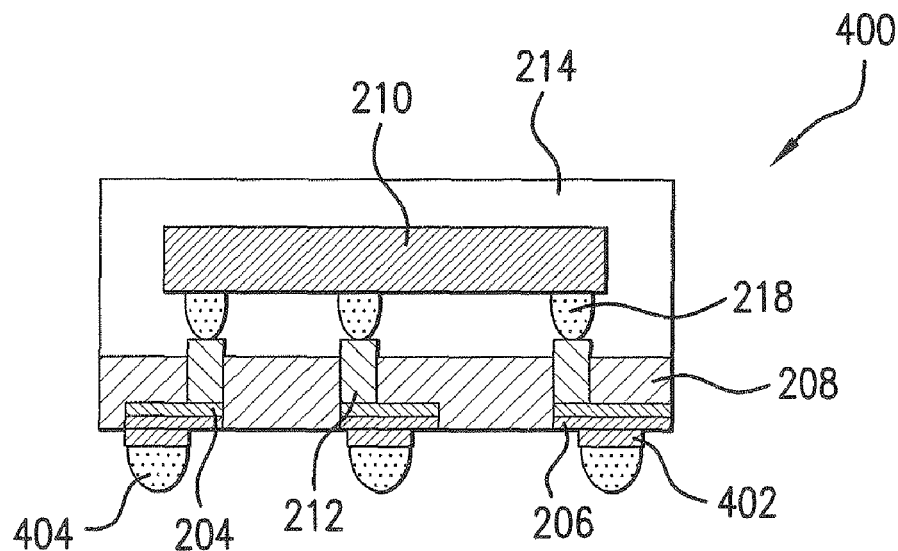
FIG. 4 illustrates a flip-chip IC package with a solder ball attached to a metal post.
Figure 5:
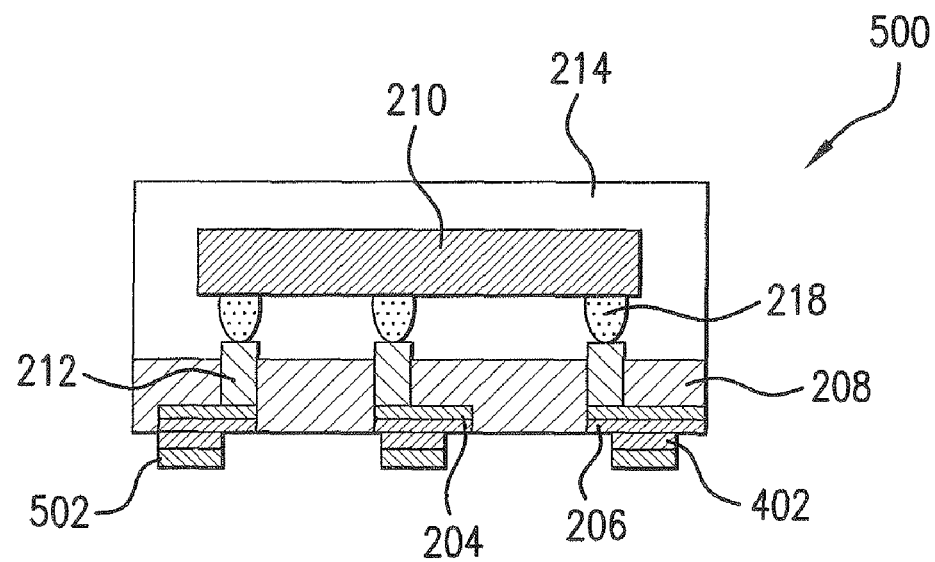
FIG. 5 shows a flip-chip IC package with a plated metal post.

As illustrated in FIGS. 4 and 5, a metal post 402 may be added to a flip-chip IC package with one metal layer, such as those illustrated in FIGS. 2E and 2F. The metal post 402 relieves thermal stresses between the flip-chip IC package with one metal layer and a PCB upon which the IC package is mounted. The metal post 402 may also stand off the flip-chip IC package with one metal layer from a PCB upon which the IC package is mounted to permit thermal expansion of the IC package. The metal post 402 may also vary the size of a bump of the solder 218. The metal post 402 may also ease connection of the IC package to a PCB. Further, the metal post 402 may simplify manufacturing by assisting extension of a conductor through a molding compound.

To add the metal post 402 to the interposer 201, the method for packaging an integrated circuit in a flip-chip IC package with one metal layer 100 is modified as follows. In a step prior to the step 102, material on one side of the baseplate 202 is partially removed to foam the metal post 402. Removal may be by etching, grinding, milling, or other metal removal means. The metal post 402 is located on a side of the interposer 201 opposite to a side of the interposer 201 upon which the IC 210 will be mounted. In the step 114, when a part of the baseplate 202 is removed, at least a part of the metal post 402 remains. In other words, the metal post 402 is formed from the baseplate 202. Thus, the metal post 402 extends beyond a surface of the photoresist 208 applied in the step 106. As illustrated in FIG. 4, a flip-chip IC package with a metal post 400 has an optional solder ball 404 coupled to the metal post 402 for coupling to a printed circuit board. Alternatively, as shown in FIG. 5, a flip-chip IC package with a metal post 500 has the metal post 402 plated with solder 502 for coupling to a printed circuit board.

III. Wirebond BGA Package with One Metal Layer

A method for packaging an integrated circuit in a wirebond BGA package with one metal layer is illustrated in FIGS. 6-9.

FIG. 6 illustrates a method 600 for packaging an integrated circuit, such as the wirebond BGA package with one metal layer. In steps 602 and 604, illustrated in FIG. 7A, a contact 700 having a conductive layer 704 and a barrier layer 706 is disposed on a baseplate 702. The barrier layer 706 is a palladium and copper alloy, nickel and copper alloy, or other electrically conductive metal that protects the conductive layer 704 from damage during removal of at least a part of the baseplate 202 in step 614. The contact 700 "fans out", or relocates, an I/O port. The baseplate 702 may be copper, aluminum, steel, or may be an alloy containing copper, aluminum, or steel.

Figure 7A:
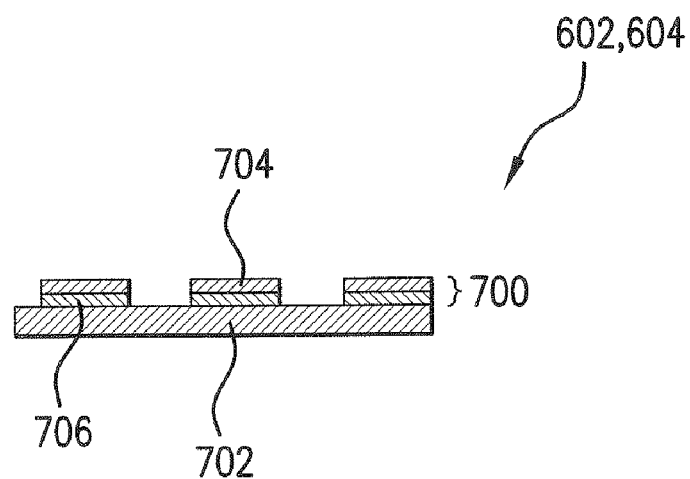
Figure 7B:
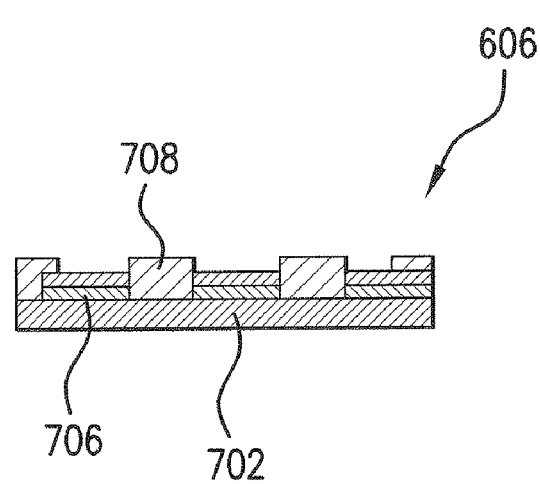

In step 606, shown in FIG. 7B, a solder mask or other photoresist layer 708 having a pattern is applied to the conductive layer 704. The photoresist layer 708 is patterned to expose the conductive layer 704 where an IC 710 is to be coupled to the conductive layer 704 with wirebonds. The photoresist layer 708 insulates part of the contact 700 and provides mechanical support to the integrated circuit package.

Figure 7C:
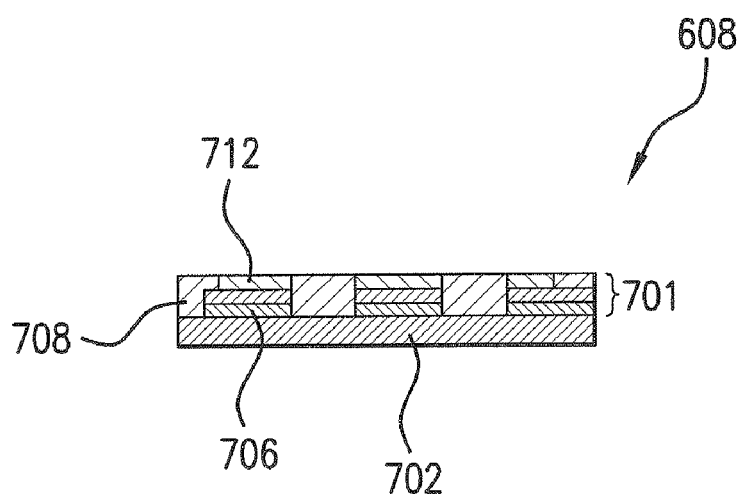

In step 608, depicted in FIG. 7C, a pad 712 is disposed on the conductive layer 704. The pad 712 may be composed of gold, silver, palladium, or another electrically conductive metal suitable for making a wirebond connection. The pad 712 is for coupling the conductive layer 704 to a conductor on the IC 710 with a wirebond 713. A coupling of the pad 712 to the conductor on the IC 710 may encompass a conductive layer interposed between the pad 712 and the conductor on the IC 710. The steps 602 through 608 form an interposer 701. The steps 602 through 608 may be used to produce multiple interposers 701 in bulk, such as in a strip format. One interposer strip contains multiple interposers 701.

Figure 7D:
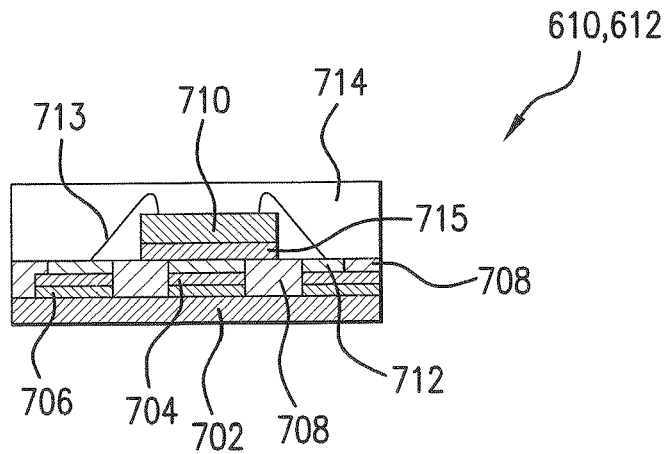

In step 610, illustrated in FIG. 7D, the IC 710 is coupled to the pad 712 on the interposer 701 by the wirebond 713. The IC 710 may be fastened to the interposer 701 with a fastener 715 such as conductive epoxy, non-conductive epoxy, film, and/or soft solder. Wirebonding occurs prior to removal of part of the baseplate 702.

In step 612, shown in FIG. 7D, the IC 710 is encapsulated with an encapsulant 714 such as epoxy. Encapsulation may be performed by molding or dispensing.

Figure 7E:
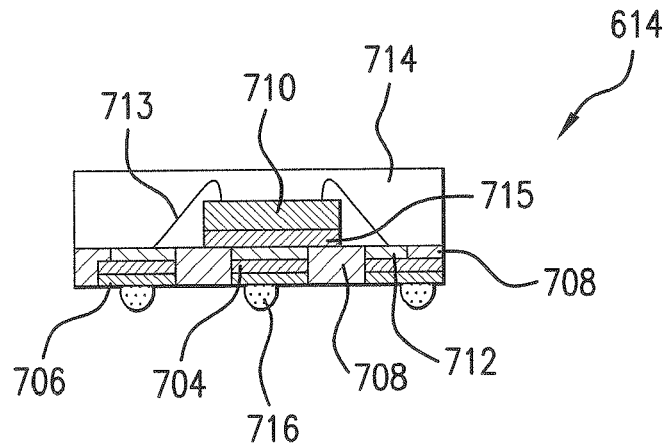
Figure 7F:
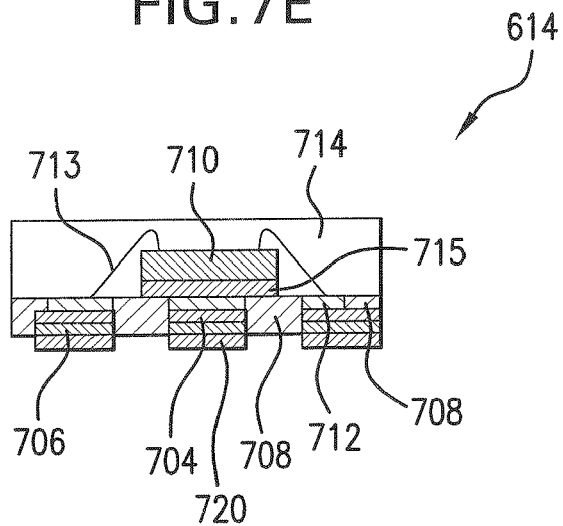

In step 614, illustrated in FIGS. 7E and 7F, at least a part of the baseplate 702 is removed. Removal may be by etching, grinding, milling, or other means of metal removal. As illustrated in FIG. 7E, an optional solder ball 716 may be coupled to the barrier layer 706 so that the contact 700 may be coupled to a printed circuit board. Alternatively, as shown in FIG. 2F, a part of the baseplate 702 not removed is plated with solder 720 so that the contact 700 may be coupled to a printed circuit board. Thus, the packaging method 600 eliminates the conventional wafer-level redistribution layer and reduces a number of manufacturing process steps to reduce manufacturing costs. A land grid array (LGA) package may be produced by the method 600.

In an example, the wirebond BGA package with one metal layer may include a plurality of pads 712 and a plurality of contacts 700. The plurality of pads 712 has a perimeter that encloses an area. The plurality of contacts 700 also has a perimeter that encloses an area. The area of the plurality of pads 712 is less than the area of the plurality of contacts 700. Thus, the contacts 700 "fan out" a plurality of IC I/O ports coupled to the pads 712 to accommodate an increased number of in/out ports, for a given die area.

Multiple wirebond BGA packages with one metal layer may be manufactured on a strip with the steps 602 through 608. The strip is similar in size to a fine-pitch BGA strip to ensure compatibility with existing fine-pitch BGA processing equipment. A slot may be formed in the strip. The slot relieves thermal stresses between two packages during the manufacturing process. During manufacture, the multiple wirebond BGA packages with one metal layer are simultaneously encapsulated in the step 612. Then, in an optional step after the step 614, the multiple wirebonded IC packages with one metal layer are singulated into individual wirebonded IC packages by dicing, such as with a wafer saw. The slot may also increase the useful life of a wafer saw used to singulate multiple flip-chip IC packages by reducing the amount of material to be removed by the wafer saw.

IV. Wirebond BGA Package with One Metal Layer and Metal Posts

As illustrated in FIGS. 8 and 9, a metal post 802 may be added to a wirebonded BGA package with one metal layer. The metal post 802 stands stand off the flip-chip IC package with one metal layer from a PCB upon which the IC package is mounted to permit thermal expansion of the IC package. The metal post 802 may also vary the size of the solder 804. The metal post 802 may also ease connection of the IC package to a PCB. Further, the metal post 802 may simplify manufacturing by assisting extension of a conductor through a molding compound.

To add the metal post 802 to the interposer 701, the method for packaging an integrated circuit in a wirebonded IC package with one metal layer 600 is modified as follows. In a step prior to the step 602, material from the baseplate 702 is partially removed, for example by etching, on one side to form a metal post 802. The metal post 802 is located on a side of the interposer 701 opposite to a side of the interposer 701 upon which the IC 710 will be mounted. In the step 614, when a part of the baseplate 702 is removed, at least a part of the metal post 802 remains. In other words, the metal post 802 is formed from the baseplate 702. Thus, the metal post 802 extends beyond a surface of the photoresist 708 applied in the step 606. As illustrated in FIG. 8, a wirebond BGA package with one metal layer and a metal post 800 has an optional solder ball 804 coupled to the metal post 802 for coupling to a printed circuit board. Alternatively, as shown in FIG. 9, a wirebond BGA package with a metal post 900 has the metal post 802 plated with solder 902 for coupling to a printed circuit board.

V. Wirebond BGA Package with One Metal Layer Interposer Having a Routing Pattern and Posts A method for packaging an integrated circuit in a wirebond BGA package with one metal layer and metal posts is illustrated in FIGS. 10-11.

FIG. 10 illustrates a method for packaging an integrated circuit in a wirebond BGA package with one metal layer and metal posts 1000. In step 1002, illustrated in FIG. 11A, a baseplate 1102 is etched on opposing sides. Etching forms a routing pattern on one side of the baseplate 1102. Etching also forms a post, integral to the baseplate 1102, corresponding to a printed circuit board pad, also integral to the baseplate 1102, on an opposite side of the baseplate 1102. After etching, the baseplate 1102 remains intact between both opposing sides. Both opposing sides of the baseplate 1102 may be etched separately or simultaneously. The baseplate 1102 may be copper, aluminum, steel, or may be an alloy containing copper, aluminum, or steel. As an alternative to etching, material may be removed from the baseplate 1102 by grinding, milling, or other suitable metal removal means.

Figure 11A:
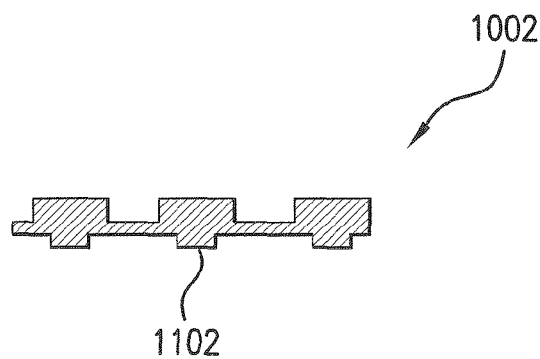
Figure 11B:
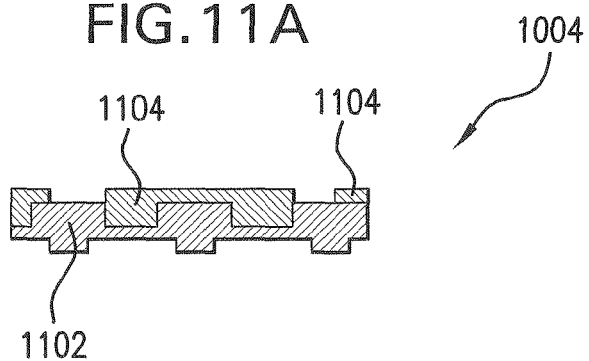

In step 1004, shown in FIG. 11B, a solder mask or other photoresist layer 1104 having a pattern is applied to the baseplate 1102. The photoresist layer 1104 is patterned to expose the baseplate 1102 where an IC 1106 is to be coupled to the routing pattern. The photoresist 1104 insulates part of the baseplate 1102 and provides mechanical support to the wirebond BGA package with one metal layer interposer.

Figure 11C:
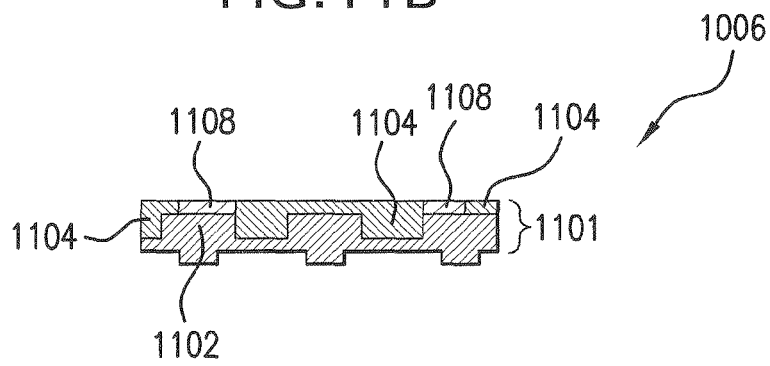

In step 1006, illustrated in FIG. 11C, a pad 1108 is disposed on the baseplate 1102. The pad 1108 may be composed of gold, palladium, silver, or another electrically conductive metal suitable for a wirebond connection. The pad 1108 is for coupling a part of the baseplate 1102 to a conductor on the IC 1106 with a wirebond 1110. A coupling of the pad 1108 to the conductor on the IC 1106 may encompass a conductive layer interposed between the pad 1108 and the conductor on the IC 1106. The steps 1002 through 1006 form an interposer 1101. The steps 1002 through 1006 may be used to produce multiple interposers 1101 in bulk, such as in a strip format. One interposer strip contains multiple interposers 1101.

Figure 11D:
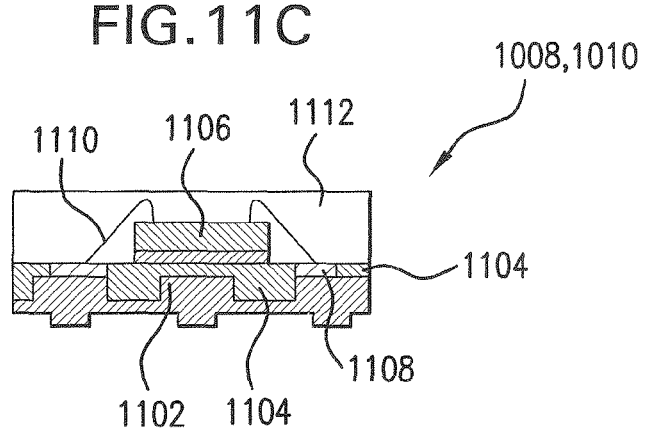

In step 1008, illustrated in FIG. 11D, a port on the IC 1106 is coupled to the pad 1108 by the wirebond 1110. The IC 1106 may be fastened to the interposer 1101 using conductive epoxy, non-conductive epoxy, film, or other materials including soft solder. Wirebonding occurs prior to removal of part of the baseplate 1102.

In step 1010, shown in FIG. 11D, the IC 1106 is encapsulated with an encapsulant 1112 such as epoxy. Encapsulation may be performed by molding or dispensing. Encapsulation occurs after wirebonding.

In step 1012, illustrated in FIGS. 12 and 13, a part of the baseplate 1102 is removed. Removal may be by etching, grinding, or other means. After the step 1012, at least a part of the metal post remains. In other words, the metal post is formed from the baseplate 1102. Thus, the metal post extends beyond a surface of the photoresist 1104 applied in the step 1004. As illustrated in FIG. 12, an optional solder ball 1200 may be coupled to the metal post for coupling to a printed circuit board. Alternatively, as shown in FIG. 13, solder 1300 is plated on the metal post for coupling to a printed circuit board. Thus, the packaging method 1000 eliminates the conventional wafer-level RDL and reduces a number of manufacturing process steps to reduce manufacturing costs. An LGA package may be produced by the method 1000.

In an example, the wirebond BGA package with one metal layer may include a plurality of pads 1108 and a plurality of metal posts. The plurality of pads 1108 has a perimeter that encloses an area. The plurality of posts also has a perimeter that encloses an area. The area of the plurality of pads 1108 is less than the area of the plurality of posts. Thus, the posts "fan out" a plurality of IC I/O ports coupled to the pads 1108 to accommodate an increased number of in/out ports, for a given die area.

Multiple wirebond BGA packages may be manufactured on a strip with the steps 1002 through 1006. The strip is similar in size to a fine pitch BGA strip to ensure compatibility with existing fine pitch BGA processing equipment. Slots may be added in the strip. The slot relieves thermal stresses between two packages during the manufacturing process. During manufacture, the multiple wirebonded IC packages are simultaneously encapsulated in the step 1010. Then, in an optional step after the step 1010, the multiple wirebond BGA packages are singulated into individual wirebond BGA packages by dicing, such as with a wafer saw. The slot may also increase the useful life of a wafer saw used to singulate multiple flip-chip IC packages by reducing the amount of material to be removed by the wafer saw.

CONCLUSION

Example embodiments of the methods, systems, and components of the present invention are described herein. As noted elsewhere, these example embodiments are described for illustrative purposes only, and are not limiting. Other embodiments are possible and are covered by the invention. Such other embodiments will be apparent to persons skilled in the relevant art(s) based on the teachings contained herein. Thus, the breadth and scope of the present invention are not limited by any of the above-described exemplary embodiments, but are defined only in accordance with the following claims and their equivalents.

What is claimed is:

1. A method for fabricating an interposer, comprising:
disposing a barrier metal pattern on a baseplate;
disposing a conductive layer on the barrier metal pattern;
applying a photoresist layer having a pattern to the conductive layer;
disposing a via on the conductive layer; and
removing at least a part of the baseplate.

2. The method of claim 1, wherein the removing includes at least one of etching, milling, and grinding of at least one portion of the baseplate.

3. The method of claim 1, further including singulating the interposer.

4. The method of claim 1, further including slotting the baseplate.

5. The method of claim 1, wherein the removing exposes a portion of the barrier metal pattern.

6. The method of claim 1, further including attaching a solder ball to the barrier layer.

7. The method of claim 1, further including solder plating the barrier layer.

8. An integrated circuit package, comprising:
a contact;
a via;
wherein the contact is coupled by the via to at least one of:
a solder ball; and
a pad for coupling to a wirebond;
an integrated circuit coupled to the via; and
photoresist attached to the contact, wherein the photoresist insulates a part of the contact.

9. The integrated circuit package of claim 8, wherein the contact includes an electrical conductor including at least one of palladium, nickel, copper, aluminum, steel, and an alloy of palladium, nickel, copper, aluminum, and steel.

10. The integrated circuit package of claim 8, wherein the contact includes a conductive layer and a barrier layer.

11. The integrated circuit package of claim 8, further including:
   a plurality of the vias; and
   a plurality of the contacts;
   wherein a first area enclosed by a first perimeter of the plurality of vias is smaller than a second area enclosed by a second perimeter of the plurality of contacts.

12. The integrated circuit package of claim 8, further including a second solder ball coupled to the contact.

13. The integrated circuit package of claim 12, wherein the second solder ball is part of a ball grid array.

14. The integrated circuit package of claim 8, further including a solder pad coupled to the contact.

15. The integrated circuit package of claim 8, wherein the integrated circuit is encapsulated.

16. The integrated circuit interposer of claim 8, wherein the pad includes an electrical conductor including at least one of gold, silver, and palladium.

17. An integrated circuit package, comprising:
   a single metal leadframe layer, including a contact, configured to relocate an integrated circuit port;
   wherein the contact couples a via to at least one of a solder ball and a pad; and
   an insulator configured to insulate the contact.

18. The integrated circuit package of claim 17, further comprising an integrated circuit coupled to the contact.

19. The integrated circuit package of claim 18, wherein the integrated circuit is encapsulated.

20. The integrated circuit package of claim 17, further including:
   a plurality of the vias; and
   a plurality of the contacts;
   wherein a first area enclosed by a first perimeter of the plurality of vias is smaller than a second area enclosed by a second perimeter of the plurality of contacts.

21. The integrated circuit package of claim 17, wherein the solder ball is a part of a ball grid array.

22. The integrated circuit package of claim 17, wherein the insulator is photoresist.

* * * * *